INVENTORS
ALFRED MAYER
JOSEPH LESKY
BY
W. S. Hill
AGENT

INVENTORS
ALFRED MAYER
JOSEPH LESKY
BY
W.S. Hill
AGENT

INVENTORS
ALFRED MAYER
JOSEPH LESKY
BY
W.S. Hill
AGENT 3,177,100
Patented Apr. 6, 1965

3,177,100
DEPOSITING EPITAXIAL LAYER OF SILICON FROM A VAPOR MIXTURE OF $SiH_4$ AND $H_2$

Alfred Mayer, Plainfield, and Joseph Lesky, Cranford, N.J., assignors to Radio Corporation of America, a corporation of Delaware Filed Sept. 9, 1963, Ser. No. 307,570
6 Claims. (Cl. 148—175)

This invention relates to improved methods of manufacturing improved semiconductor devices, and more particularly, to improved methods of fabricating epitaxial silicon layers on semiconductive wafers.

Epitaxial layers on semiconductive wafers have been fabricated by forming a halogen compound of a semiconductor such as germanium, silicon, and the like, then passing the vapors of the particular semiconductor, and reducing the halogen compound with hydrogen. The vaporized halides tend to transport conductivity modifiers, so that the junctions between the substrate wafer and the epitaxial layer are not as abrupt, and the resistivity of the epitaxial layer is not as high or as uniform, as is desirable for some device applications.

Attempts have also been made to deposit epitaxial silicon layers on a semiconductive wafer by heating the wafer in an ambient of silane to a temperature high enough to decompose the silane. These attempts have not hitherto produced satisfactory epitaxial layers, and the method has been regarded as unsafe, because of the explosive nature of silane. The term "silane" is used throughout to denote silicon tetrahydride, $SiH_4$.

It is advantageous to form epitaxial layers of semiconductive materials with a mirror-smooth surface. It is also desirable that the epitaxial layers formed be substantially monocrystalline. It is particularly advantageous to produce epitaxial layers with a high degree of structural perfection.

Accordingly, it is an object of this invention to provide an improved method of fabricating improved semiconductor devices.

Another object of the invention is to provide an improved method of depositing an epitaxial layer on semiconductive wafers.

Still another object is to provide an improved method of depositing epitaxial silicon layers having a mirror-smooth surface on a semiconductive wafer.

But another object is to provide an improved method of depositing on a semiconductive wafer an epitaxial silicon layer having a high degree of structural perfection.

These and other objects and advantages are attained by a process that includes the step of heating the semiconductive wafer in an ambient consisting essentially of hydrogen and 0.01 to 1.5 volume percent silane. Advantageously the surface of the semi-conductive wafer is cleaned, for example, by means of an etchant which leaves a smooth surface on the wafer, and by heating the wafer in hydrogen, just before the step of heating the wafer in a hydrogen-silane ambient. According to one embodiment, a gaseous conductivity modifier is added to the hydrogen-silane ambient.

The invention will be described in greater detail in the following examples, considered in conjunction with the accompanying drawing, in which.

*Example I*

Figure 3A:
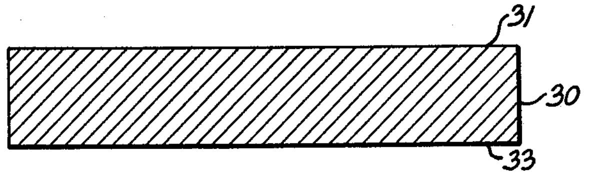
FIGURE 3 is a cross-sectional view of a wafer at successive steps in one process of fabricating a semiconductor embodying the invention; and, FIGURE 4 is a cross-sectional view of a wafer at successive steps in another method of fabricating a semiconductor device.

A wafer 30 (FIGURE 3*a*) of monocrystalline semiconductive material is prepared with two opposing major faces 31 and 33. The exact size, shape and resistivity of wafer 30 is not critical. In this example, wafer 30 is about 30 mils square, 4 mils thick, and consists of N-type silicon having a resistivity of about .001 ohm-cm. Preferable, wafer 30 is lapped and polished, then lightly etched to remove work damage on its surface, so that major wafer faces 31 and 33 are smooth and flat.

Figure 1:
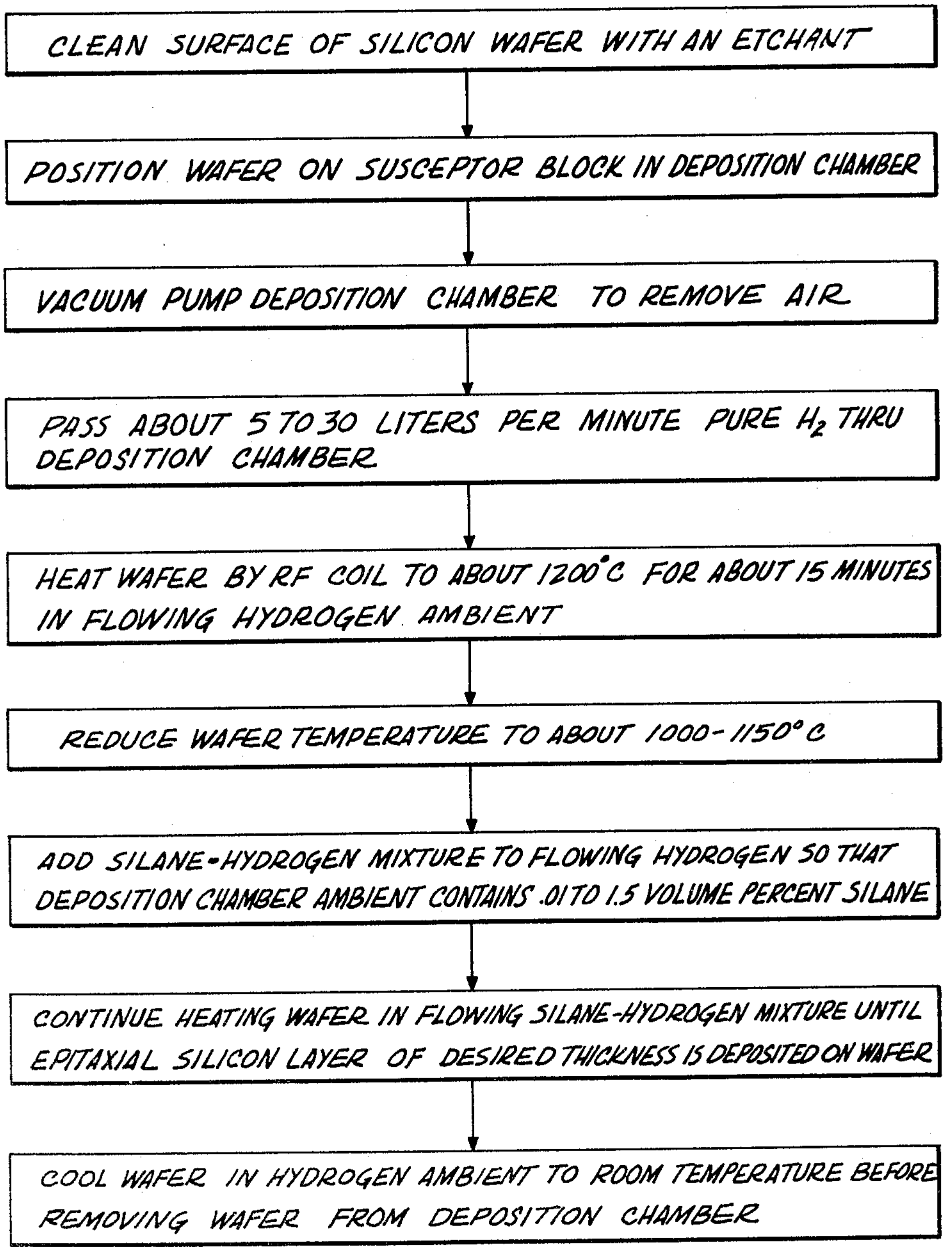
FIGURE 1 is a flow sheet of a method of depositing an epitaxial silicon layer on a semiconductive wafer according to one embodiment of the invention.
Figure 2:
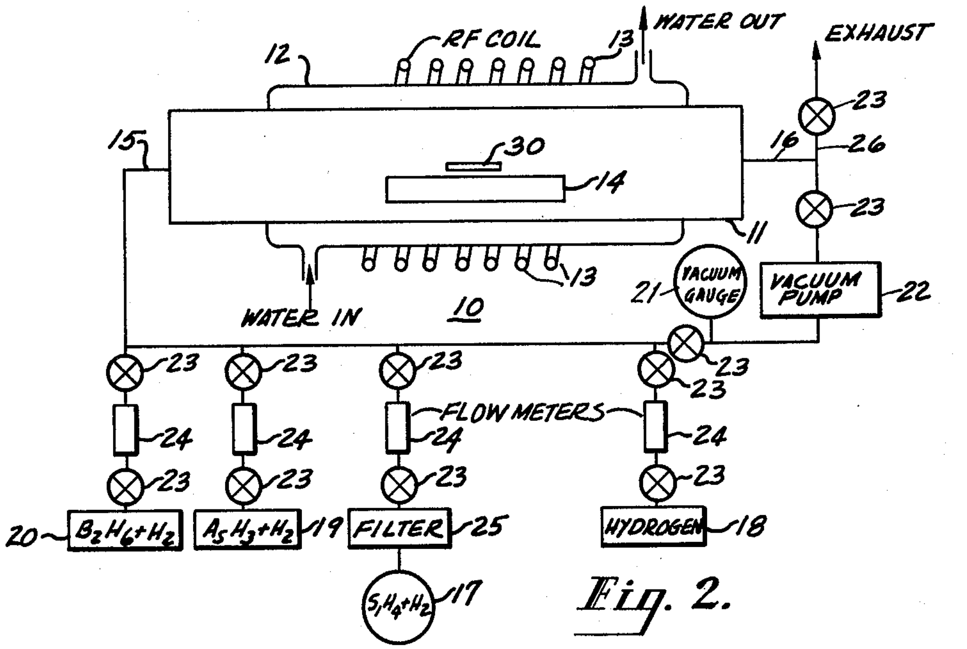
FIGURE 2 is a cross-sectional view of apparatus useful in the practice of the invention.

Apparatus 10 (FIGURE 2) comprises a reaction vessel or deposition chamber 11 having an inlet tube 15, an outlet tube, a water jacket 12, and an RF coil 13 surrounding the water jacket. Reaction vessel 11 includes a susceptor block 14 of high conductivity material, which is used to provide additional coupling with the RF coil 14 because the mass of the substrate wafer 30 is small. In this example, susceptor block 14 consists of high conductivity silicon. Reaction vessel 11 and its associated tubing are preferably made of a refractory insulating material such as fused quartz.

Feeding into inlet tube 15 are four gas sources; a cylinder 17 consisting of a mixture of silane and hydrogen; a source 18 of pure dry high purity hydrogen, such as that obtained by diffusion through palladium; a cylinder 19 containing an arsine-hydrogen mixture; and a cylinder 20 containing a borane-hydrogen mixture. The flow of gases in the apparatus 10 is controlled by a plurality of valves 23. Advantageously, flow meters 24 may be utilized to monitor the rates of flow of each gas.

Outlet tube 16 is connected to a T-shaped tube 26, one end of which leads to an exhaust while the other leads to a vacuum pump 22 and a vacuum gauge 21.

The silicon wafer 30 is positioned on susceptor block 14 in apparatus 10. Reaction vessel 11 is evacuated by means of pump 22 until the ambient pressure in the vessel 11 is reduced below 0.1 micron Hg. The reaction vessel is then flushed with pure dry palladium-diffused hydrogen from source 18. The flow of hydrogen is monitored at about 5 to 30 liters per minute.

While continuing the flow of hydrogen, high frequency electrical power is supplied to RF coil 13 so as to heat susceptor block 14 and silicon wafer 30 to a temperature of about 1200° C. Wafer 30 is maintained at this temperature for about 15 minutes in an ambient of flowing pure dry hydrogen. The purpose of this step of heating the wafer in hydrogen is to clean the surface of wafer 30 of any film of semiconductor oxides. A surface film of silicon dioxide reacts with the bulk silicon under these conditions to form silicon monoxide, which is removed by evaporation and by reaction with the hydrogen ambient. Such removal of any semiconductor oxide film is advantageous for best results.

Figure 3B:
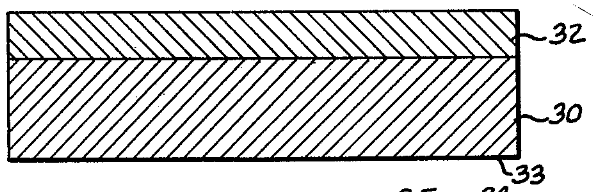

The electrical power supply is reduced, so that the temperature of wafer 30 drops to a temperature between about 1000° and about 1150° C. The mixture of silane and hydrogen from cylinder 17 is then added to the hydrogen coming from source 18, so that the gas mixture flowing through the reaction vessel 11 consists of about .01 to 1.5 volume percent silane, balance hydrogen. The silane decomposes in reaction vessel 11 in accordance with the equation.

$$SiH_4 \rightarrow Si + 2H_2\uparrow$$

and deposits as an epitaxial layer 32 (FIGURE 3*b*) on wafer 30. Mixtures of silane and inert gases such as argon have been heated to produce high-purity silicon, but mixtures of silane and hydrogen have not been used, since as indicated above, hydrogen is a decomposition produce of silane, and normally the presence of a high concentration of a reaction product tends to drive the equilibrium state of a reversible reaction toward the left.

The rate of deposition of the epitaxial layer 32 depends on the concentration of silane on the reaction vessel 11. Accordingly, the epitaxial layer 32 may be made as thick as desired by varying the time during which the wafer is heated in the silane-hydrogen mixture. In this example, the epitaxial layer 32 is about .5 mil thick, and has an electrical resistivity of about 30 ohm-cm. The valves of the silane-hydrogen cylinder 17 are closed, the electrical power supply to RF coil 13 is interrupted, and wafer 30 is permitted to cool in an ambient of pure dry hydrogen to room temperature before removal of the wafer from apparatus 10.

The conductivity type of the epitaxial layer 32 thus formed depends on the impurities in the silane, and is generally N-type. Owing to the influence of the substrate on the orientation of the deposited material, the epitaxial layer 32 is monocrystalline; in fact, the crystal lattice of silicon layer 32 is an extension of the crystal lattice of wafer 30.

Figure 3C:
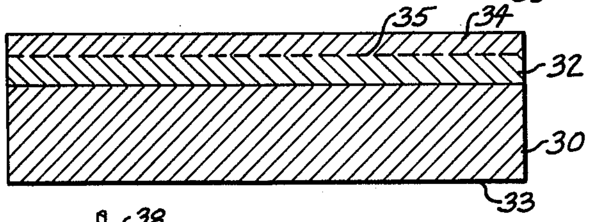

Referring now to FIGURE 3*c*, a P-conductivity type modifier or acceptor is diffused into a limited portion 34 of epitaxial layer 32 by standard techniques which are known to the semiconductor art, and need not be described here. Portion 34 of epitaxial layer 32 is thus converted to P-type and a rectifying barrier or p-n junction 35 is formed in the epitaxial layer 32 at the interface between the P-type region 34 and the N-type remainder of the layer.

Figure 3D:
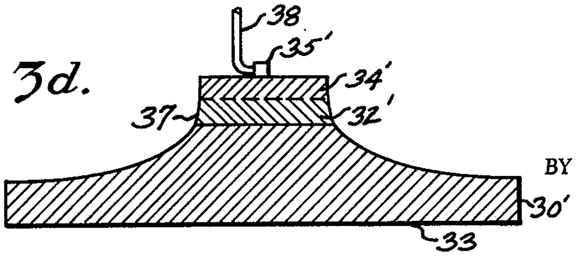

A portion of the epitaxial layer 32 is masked with an acid resist (not shown) such as apiezon wax or paraffin wax, and the wafer is then immersed in a suitable etchant, such as a mixture of hydrofluoric acid and nitric acids, for a period of time sufficient to remove the unmasked portion of epitaxial layer 32. The wafer is washed in distilled water, and the acid resist is removed by means of a suitable solvent, such as carbon tetrachloride, leaving the eched wafer 30′ (FIGURE 3*d*) with a mesa 37 which includes the remaining portion 32′ of the epitaxial layer, the remaining portion 34′ of the P-type diffused region, and the remaining portion 35′ of the rectifying barrier. An electrical lead wire 38 is bonded to the top of mesa 37 by any convenient technique, such as soldering or thermocompression bonding. The mesa diode device thus fabricated is then mounted and encapsulated by methods known to the transistor art, such as those described in Transistor Technology, volumes I–III, D. Van Nostrand Co., Princeton, New Jersey, 1958.

*Example II*

Figure 4A:
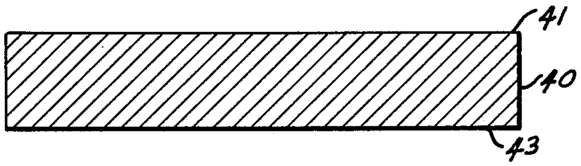

In this example, a monocrystalline P-conductivity type wafer 40 (FIGURE 4*a*) is prepared with two opposing major faces 41 and 43. Advantageously, at least one major face 41 is lapped, polished, and etched so as to be smooth and flat.

Figure 4B:
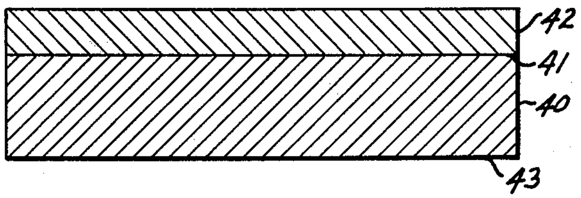

Wafer 40 is positioned on susceptor block 14 of apparatus 10 (FIGURE 2) with major face 41 uppermost. An epitaxial silicon layer 42 (FIGURE 4*b*) about 1 micron thick is deposited on major wafer face 41 in the manner described above in Example I, that is, by first evacuating the reaction vessel 11 to a pressure below 0.1 micron Hg, then purging the reaction vessel 11 with pure dry palladium-diffused hydrogen, heating the wafer in an ambient of pure flowing hydrogen for about 15 minutes at about 1200° C., cooling the wafer to about 1000°–1150° C., and passing a mixture of silane and hydrogen through the reaction vessel, so that the ambient in the reaction vessel contains about .01 to 1.5 volume percent silane, balance hydrogen. However, in this example, some of the arsine-hydrogen mixture from source 19 is added to the silane-hydrogen mixture flowing into the reaction vessel 11 during the deposition of epitaxial layer 42. Suitably, the doping agent mixtures in tanks 19 and 20 contain about 10 to 1000 parts per million by volume of a gaseous conductivity modifier in hydrogen. The amount of this mixture added to the ambient flow around the wafer is about .001 to 1 volume percent. As a result, sufficient arsenic atoms are incorporated in epitaxial layer 42 to induce N-type conductivity in layer 42. A rectifying barrier or p-n junction is thereby formed at or close to the interface 41 between P-type wafer 40 and N-type epitaxial layer 42.

Figure 4C:
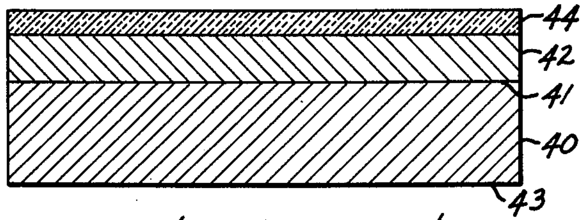

Referring now to FIGURE 4*c*, a layer 44 of phosphorus doped silicon oxide is deposited on the epitaxial silicon layer 42. The silicon oxide layer 44 may be formed by oxidizing the surface of the silicon layer, for example, by heating the wafer in air or in steam. Alternatively, the silicon oxide layer 44 may be formed by heating the wafer in the vapors of an organic siloxane compound, as described in U.S. Patent 3,087,939, issued May 14, 1963, to E. J. Jordan and D. J. Donahue, and assigned to the assignee of this application. The phosphorus may be incorporated in the silicon oxide layer during the deposition step, or may be introduced therein by a diffusion step after the deposition step.

Figure 4D:
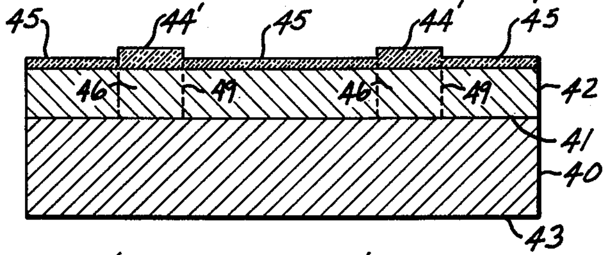

Predetermined portions of the phosphorus-diffused silicon oxide layer 44 are now removed, leaving the wafer 40 with portions 44′ of the doped oxide as illustrated in FIGURE 4*d*. The removal of selected portions of silicon oxide layer 44 may be accomplished by lapping tools or grinding wheels, or by masking and etching techniques.

Wafer 40 is then heated in an ambient of air or oxygen for about ½ hour at about 1100° C. During this step, phosphorus from the remaining portions of the doped silicon oxide layer 44 diffuses through the epitaxial layer 42. The portions 46 (FIGURE 4*d*) of epitaxial layer 42 immediately beneath the doped silicon oxide portions 44′ are converted to N+ conductivity. At the interface 49 between phosphorus-diffused portions of epitaxial layer 42 and the remainder of the layer, an N—N+ junction is formed. The heating step also causes the formation of a fresh silicon oxide layer 45 on the surface of epitaxial layer 42.

Figure 4E:
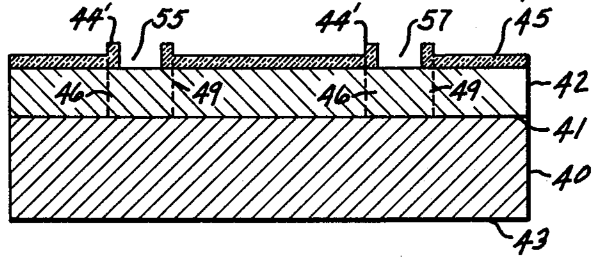

Preselected portions of the silicon oxide layer 44 are then removed so as to expose areas 55 and 57 of the epitaxial layer 42 within the phosphorus-diffused regions, leaving the wafer 40 as illustrated in FIGURE 4*e*. The removal may be accomplished by lapping or grinding techniques, or by means of masking and etching processes.

Figure 4F:
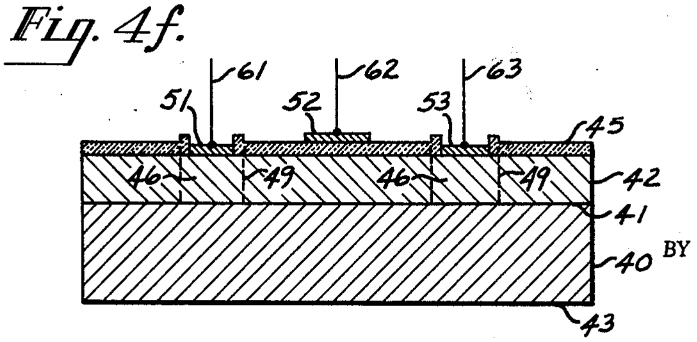

Metallic electrodes 51 and 53 (FIGURE 4*f*) are now deposited on the exposed areas 55 and 57 respectively of the epitaxial layer 42. The metallic electrodes may, for example, consist of chromium and silver, and may be deposited by evaporation. At the same time, another metallic electrode 52 is deposited on the silicon oxide layer 45 between contacts 51 and 53. To complete the device, electrical lead wires 61, 62 and 63 are attached to electrodes 51, 52 and 53 respectively by any convenient method, such as by soldering or by a thermocompression bond.

The device thus fabricated is an insulated gate field effect triode. In operation, electrode 51 may serve as the source electrode, electrode 53 as the drain electrode, and electrode 52 as the gate or control electrode. In the symmetrical structure of this example, the source and drain electrodes may be exchanged. The N-type portion of the epitaxial layer 42 between electrodes 51 and 53 is the conducting channel. When a positive bias is applied to the gate electrode 52, the device operates in the current enhancement mode. When negative bias is applied to the gate electrode 52, the device operates in the current depletion mode. For a description of the operation of field effect devices, see P. K. Weimer, The TFT—A New Thin Film Transistor, Proc. IRE 50, p. 1462, June 1962.

By the processes described above, the epitaxial silicon layers deposited have smooth flat surfaces, and a high degree of structural perfection. A conductivity modifier may be introduced into the epitaxial layer in a uniform fashion. This is advantageous when it is desired to avoid the concentration gradient produced by the conventional technique of introducing a conductivity modified into an epitaxial layer by the usual diffusion process. Moreover, a very abrupt junction may be formed by the processes described above between the substrate wafer and the deposited epitaxial layer.

The above embodiments of the invention have been described by way of example only, and not limitation. If desired, the conductivity type of the various wafer regions described may be reversed, utilizing appropriate acceptors and donors. Other compatible crystalline semiconductors, such as silicon-germanium alloys and germanium, may be utilized as substrates instead of silicon. Silicon may also be deposited in this manner on metallic or insulating substrates. Other variations and modifications may be made by those skilled in the art without departing from the spirit and scope of the instant invention as described in this specification and in the appended claims.

What is claimed is:

1. The method of forming an epitaxial silicon layer on a semiconductive wafer, comprising heating said wafer at a temperature of about 1000° to 1350° C. in an ambient consisting essentially of hydrogen and 0.01 to 1.5 volume percent silane.

2. The method of forming an epitaxial silicon layer on a crystalline silicon wafer, comprising cleaning the surface of said wafer and heating said wafer at a temperature of about 1000° to 1350° C. in an ambient consisting essentially of hydrogen and 0.01 to 1.5 volume percent silane.

3. The method of forming an epitaxial silicon layer on a crystalline silicon wafer, comprising etching one major face of said wafer to leave a smooth surface on said wafer and heating said wafer at a temperature of about 1000° to 1350° C. in an ambient consisting essentially of hydrogen and 0.01 to 1.5 volume percent silane.

4. The method of forming an epitaxial silicon layer on a crystalline silicon wafer, comprising the steps of etching at least one major face of said wafer, to leave a smooth surface on said wafer heating said wafer to a temperature of about 1200° C. for about 15 minutes in a flowing hydrogen ambient, then maintaining the wafer temperature at about 1100° C. while adding about 0.01 to 1.5 volume percent silane to said flowing hydrogen ambient.

5. The method of forming an epitaxial silicon layer on a crystalline silicon wafer, comprising the steps of etching at least one major face of said wafer, to leave a smooth surface on said wafer heating said wafer to a temperature of about 1200° C. for about 5 to 30 minutes in a flowing hydrogen ambient, then maintaining the wafer temperature at a temperature of about 1100° C. while adding to said flowing hydrogen ambient about 0.01 to 1.5 volume percent silane and about .001 to 1 volume percent of a mixture of hydrogen and about 10 to 1000 parts per million of a gaseous conductivity modifier.

6. The method as in claim 1, in which said gaseous modifier is selected from the group consisting of $B_2H_6$, $PH_3$ and $AsH_3$.

References Cited by the Examiner

UNITED STATES PATENTS

| | | | |
|---|---|---|---|
| 2,916,359 | 12/59 | Ellis et al. | 23—223.5 |
| 2,993,762 | 7/61 | Sterling et al. | 23—223.5 |
| 3,078,150 | 2/63 | Raymond | 23—223.5 |

FOREIGN PATENTS

| | | |
|---|---|---|
| 745,698 | 2/56 | Great Britain. |

DAVID L. RECK, *Primary Examiner.*